Aug. 17, 1965
T. R. O'MEARA
WIDE BAND AMPLIFIER
Filed July 28, 1961
3,201,710
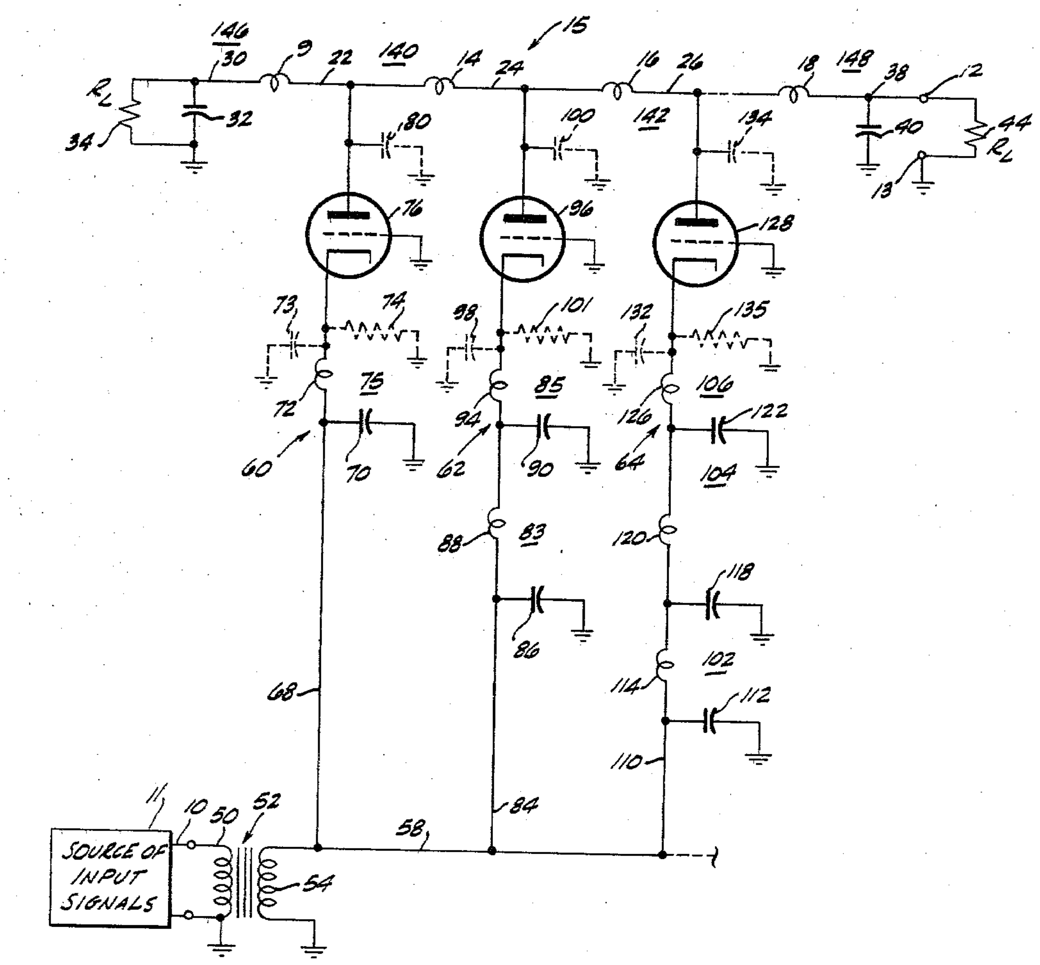
INVENTOR.
THOMAS R. O'MEARA,
BY
Walter J. Adam
ATTORNEY.

3,201,710
WIDE BAND AMPLIFIER
Thomas R. O'Meara, Los Angeles, Calif., assignor to Hughes Aircraft Company, Culver City, Calif., a corporation of Delaware
Filed July 28, 1961, Ser. No. 127,734
7 Claims. (Cl. 330—54)

This invention relates to wide band amplifier circuits and particularly to an improved wide band amplifier that provides very large gain-bandwidths.

As is well known, a conventional triode amplifier is limited in bandwidth because of the effects of the inter-electrode capacitance and load resistance. Another conventional arrangement for wide band amplification is the chain or distributed amplifier in which pentodes are arranged in a grounded cathode configuration between two series paths of inductive elements to form cascaded delay sections with the distributed capacitance of the tubes utilized as a parameter of the delay sections. The currents through all tubes are equally delayed so that all signal components add in phase at the output load.

Amplifiers utilizing this principle may achieve useful gains with bandwidths of the order of 200 mc. (megacycle) using conventional pentode tubes and as high as 300 mc. with specially adapted tubes. Although in theory a large number of parallel arranged tubes in the chain amplifier would provide much greater gain bandwidth products, certain high frequency effects limit the bandwidths to the above values. The inter-electrode capacitance in conjunction with the plate or control grid inductance limits the useful gain to the self-resonant frequency of these electrodes. Also, the inductance of the cathode lead provides a conductance component to the tube input impedance of the tubes resulting in attenuation of the signal wave so that a very small signal reaches the last tubes in the chain. Further, the inductance of the connecting wires to the screen grid or other shielding grids causes these electrodes to operate at other than ground potential sometimes resulting in instability at high frequencies.

A large number of triodes have very much larger gain bandwidth indices than available in the best pentodes. However, triodes are conventionally employed in the grounded-grid configuration for reasons of stability, in which arrangement a coupling network with wide band impedance transformation capability is required for circuit gain. Further, in conventional chain amplifiers, a triode cannot be utilized in a grounded grid configuration because of the high input conductance loading and cannot be utilized in a grounded cathode arrangement because of instability resulting from undesired feedback.

It is therefore an object of this invention to provide a wide band amplifier configuration which operates with much greater bandwidths than the conventional chain amplifier and much greater gain-bandwidths than the conventional triode amplifier.

It is a further object of this invention to provide a stable operating wide band amplifier configuration utilizing triode type amplifying devices to take advantage of the reltaively large gain-bandwidth characteristics thereof.

It is a still further object of this invention to provide a low pass amplifier having useful power gain by utilizing an improved combination of series and parallel transmission paths.

It is another object of this invention to provide a wide band amplifier which accounts for loading effects of the tubes so that a large number of tubes may be utilized to provide a very large power gain.

Briefly, the wide band amplifier circuit in accordance with this invention includes a transmission path of series arranged delay sections coupled between terminating loads. A plurality of amplifying devices such as triodes arranged in grounded grid configuration have anodes coupled to the series transmission path. The input signal is applied through parallel paths of delay sectons to the terminating impedances of the cathodes of the triodes. Each parallel path has a selected number of delay sections so that signals applied to the load add in phase to provide a gain proportional to the gain of each tube times the number of tubes, with no depreciation of bandwidth. The inter-electrode capacitance and the input loading impedance of the tubes are included as parameters in the delay sections so that a large number of parallel paths may be utilized with a resulting large gain-bandwidth.

The novel features which are believed to be characteristic of this invention, both as to its organization and method of operation, together with further objects and advantages thereof will be better understood from the following description considered in connection with the accompanying drawing, in which:

The sole figure is a schematic circuit diagram of the wide band amplifier in accordance with this invention.

The amplifier circuit which is a combination parallel and distributed amplifier configuration provides amplification between a source of input signals 11 and output terminals 12 and 13. The circuit includes a series path 15 of inductors 9, 14, 16 and 18 coupled respectively together by leads 22, 24 and 26. The inductor 9 is also coupled to a lead 30 and through both a capacitor 32 and a load resistor 34 to ground. The inductor 18 is also coupled to a lead 38 and through a capacitor 40 to ground as well as to the output terminal 12. A load resistor 44 is coupled between the output terminal 12 and the output terminal 13 which is in turn coupled to ground. The load resistor 44 and the load resistor 34 which may be substantially equal have values $R_L$.

Input signals are applied through an input lead 10 from the source of signals 11 to one end of a first winding 50 of an impedance matching transformer 52, the other end being coupled to ground. A second winding 54 of the transformer 52 has one end coupled to ground and the other end coupled to a common lead 58 which in turn is coupled through a plurality of parallel paths 60, 62 and 64 to the series path 15. The parallel path 60 includes a lead 68 coupled to ground through a capacitor 70 and to one end of an inductor 72, the other end being coupled to the cathode of a triode tube 76. A capacitor 73 shown dotted represents the cathode to grid capacitance of the tube 76 as well as corresponding wiring capacitance and a resistor 74 shown dotted represents the cathode to grid impedance thereof. The capacitor 70, the inductor 72 and the capacitor 73 form a delay section 75 having a characteristic impedance equal to the value of the resistor 74 to prevent reflections. The tube 76 has a grid coupled to ground for stable operation and an anode coupled to the lead 22. A capacitor 80 represents the distributed capacitance between the anode to grid of the tube 76 plus additional corresponding wiring capacitance.

The series path 62 which includes two delay line sections 83 and 85 has a lead 84 coupled from the lead 58 through a capacitor 86 to ground and to one end of an inductor 88. A capacitor 90 is coupled between the other end of the inductor 88 and ground and an inductor 94 is coupled between the inductor 88 and the cathode of a triode tube 96. The tube 96 has a control grid coupled to ground for highly stable operation. The distributed cathode to grid capacitance and the anode to grid capacitance of the tube 96 plus additional wiring capacitances are represented by capacitors 98 and 100 and the cathode to grid resistance is represented by a resistor 101 all shown dotted. The delay section 83 is formed from the capacitor 86, inductor 88 and the capacitor 90 and the section 85 is formed from the capacitor 90, inductor 94 and the capacitor 98. The characteristic impedance of the delay sections 83 and 85 is selected equal to the terminating impedance of the resistor 101.

The series path 64 includes three delay sections 102, 104 and 106. The lead 58 is coupled to a lead 110 which in turn is coupled to ground through a capacitor 112 and to one end of an inductor 114. The other end of the inductor 114 is coupled through a capacitor 118 to ground and to one end of an inductor 120 of the delay section 104. A capacitor 122 is coupled between the other end of the inductor 120 and ground and an inductor 126 is coupled in series between the inductor 120 and the cathode of a triode tube 128. The grid of the tube 128 is coupled to ground. The distributed capacitance between the cathode and grid and the anode and grid plus wiring capacitances of the grounded grid tube 128 are represented by respective capacitors 132 and 134 and the cathode to grid resistance of the tube 128 is represented by a resistor 135 equal to the characteristic impedance of the parallel path 64. The delay section 102 includes the capacitors 112 and 118 and the inductor 114, the delay section 104 includes the capacitors 118 and 122 and the inductor 120 and the delay section 106 includes the capacitors 122 and 132 and the inductor 106. Although for convenience of illustration only three vacuum tubes and parallel paths are shown, any desired number may be utilized within the principles of the invention as indicated by the dotted portions of the leads 26 and 58.

The anodes of the tubes 76, 96 and 128 are respectively coupled to the leads 22, 24 and 26. The series path 15 includes a delay section 140 formed from the distributed capacitors 80 and 100 and the inductor 14 and a delay section 142 formed from the distributed capacitors 100 and 134 and the inductor 16. A terminating delay section 146 includes the distributed capacitor 80, the capacitor 32 and the inductor 9 and a terminating delay section 148 includes the capacitors 134 and 40 and the inductor 18.

In operation, signals which may be of wide spectral width are applied to the transformer 52 from the source 11. After impedance transformation the signals are applied to the parallel paths 60, 62 and 64 and distributed after varying time delays to the cathodes of each amplifier tube 76, 96 and 128. It is to be noted that because of the parallel amplifying paths, a low impedance is presented to signals on the lead 58. The signals are then applied to the series transmission line 15. To further consider the operation, signal current flows through the anode to cathode path of each tube being equally divided and flowing into the lead 58 with varying time delays down each parallel path 60, 62 and 64. The signal current flowing into the anodes of the tubes 76, 96 and 128 is also divided equally between the load resistors 34 and 44. Because of the relatively high impedance level of the series network looking into the anodes of the amplifier tubes, power gain at the load resistor 44 is provided even though there is a signal current loss of one-half at the resistor 34.

The gain and frequency characteristics of the amplifier may be further understood by considering the principle of superposition. If all of the amplifier tubes except one deliver current to ground instead of to the series path, it can be seen that for frequencies below the cutoff frequency of the artificial transmission lines or delay lines, the signal from the one tube is applied to the load resistor 44 or to the output terminals 12 and 13 with a delay determined by the number of sections in the transmission path. It is to be noted that the delay line sections are selected so that the signals transmitted by each tube 76, 96 and 128 between the lead 58 and the output terminals 12 and 13 have the same total delay or phase shift. Therefore, the composite output signal of the signals applied through the parallel paths 60, 62 and 64 at the load 44 is defined as a function of the product of the number of amplifier tubes and the output signal of any single tube as described above. The current signal at the load 44 is a function of approximately one-half of the product of the number of amplifier tubes and the output signal current of one tube delivering signal current to the series path 15. Because the amplifier, as illustrated, does not develop a stop band at low frequencies, low pass characteristics are provided.

The internal delay sections such as 75 and 140 may be constant K sections, for example. The terminating section may be constant K sections or M derived sections. It is to be noted that the invention is not limited to a particular type of transmission sections but any suitable type or types may be utilized. For example, M derived sections may be utilized as internal delay sections by providing suitable phase compensation when required.

One of the principal features of the delay sections is that they absorb the distributed capacitances of the tubes so that wide band operation is provided. As an example of determining element values for the delay sections, the tubes may be first selected and a certain impedance level for a given gain may thereby be specified. These characteristics determine the value of the inductors of the sections and the LC (inductance-capacitance) constants which specify a desired time delay and the cutoff frequency. Also, the bandwidth may be specified and the tubes selected with the value of distributed capacitance determining the values of inductors. The LC constant determines the time delay and the ratio L/C determines the characteristic impedance. The cathode to grid impedance represented by resistors 74, 101 and 135 which are the terminating impedances of the transmission lines of the parallel paths 60, 62 and 64, determine the required characteristic impedances of the input delay sections. In order that the loading effects are accounted for in accordance with the invention, the capacitors 73, 98 and 132 representing the distributed cathode to grid capacitance of the tubes 76, 96 and 128 are a capacitive element or parameter in the delay sections 75, 85 and 106. Also, the distributed anode to grid capacitance represented by the capacitors 80, 100 and 134 of the tubes 76, 96 and 134 are a capacitive element or parameter of the respective delay line sections 146, 140, 142 and 148. The load resistors 34 and 44 having an equal value $R_L$ are the terminating impedances of the delay sections of the series path 15.

It is to be noted that semiconductor devices such as transistors may be utilized in place of the triode amplifiers. Because the cathode to grid resistance of the tubes 76, 96 and 128 is an essential parameter for terminating the parallel transmission paths, those transistors which have relatively low conductances may require a shunting fixed conductance to realize the resistance of the resistors 74, 101 and 135.

To consider the useful power gain developed in accordance with this invention, the input power $P_{IN}$ is assumed to be equally divided between the cathodes of N amplifier tubes. Therefore, the power $P_C$ into each cathode is:

$$P_C = \frac{P_{IN}}{N} \quad (1)$$

and the input signal current $i_P$ into each cathode is:

$$i_P = \sqrt{\frac{P_{IN}}{NR_N}} = \sqrt{\frac{P_{IN}}{N} g_m} \quad (2)$$

where $R_N$ is the value of the terminating resistors 74, 101 and 135 and $g_m$ is the mutual conductance of the tubes, that is, the partial derivative of anode current with respect to grid-cathode voltage.

The output power $P_O$ can be determined to be:

$$P_o = \frac{i_P^2 N_2 R_L}{4} \quad (3)$$

where $R_L$ is the value of the load resistance. From Equation (2) the power gain is approximately:

$$\frac{P_o}{P_{IN}} = \frac{N g_m R_L}{4} \quad (4)$$

Thus, when $g_m R_L$ is chosen less than unity to obtain a desired bandwidth, a useful power gain results when N is larger than 4. It is to be noted that any number of parallel paths may be utilized in accordance with the invention, such as six to eight although only three paths are shown for convenience of illustration.

The power gain developed by the conventional chain amplifier within the pass band region may be expressed as:

$$\frac{P_o}{P_{IN}}=\frac{N^2}{4}g_m^2 R_L R_g \qquad (5)$$

where $R_g$ and $R_L$ are the impedance levels of the grid and anode lines with the cathodes grounded.

Although the gain is dependent on $g_m^2 R_L R_g$ in the conventional cascade amplifier the value of $g_m^2 R_L R_g$ is typically chosen less than or equal to unity. As is well known, when $g_m^2 R_L R_g$ is greater than one the bandwidth is relatively narrow. A low impedance or small value of $R_L$ is required for a large bandwidth as the overall bandwidth or cutoff frequency is a function of the resistance-capacitance product. Therefore, squaring of $g_m\sqrt{R_L R_g}$ in Equation (5) for the conventional chain amplifier may be detrimental rather than advantageous while in the amplifier of this invention, $g_m R_L$ which may be less than unity, is not squared in the power gain Equation (4).

Another advantage of the wide band amplifier of the invention is that a much larger value of N may be utilized than in the conventional chain amplifier because loading effects are accounted for in the delay sections of the parallel paths. Further, the higher values of $g_m$ typically obtainable from triodes and the lower distributed capacitance thereof further increases the gain as defined by Equation (4). Also, the higher mutual conductance and lower capacitance of the triodes increases the bandwidth in the circuit in accordance with the invention.

The wide band amplifier of the invention without the transformer 52 has a low input impedance because of the parallel paths coupled to the lead 58 and a high output impedance so that the input and output impedance levels are not comparable. However, when similar impedance levels are required such as in the cascading of two similar amplifiers, the transformer 52 may be utilized. It is to be noted that magnetic-cored transformers are readily available at bandwidths of 500 megacycles and larger, which also pass substantially low frequencies.

Thus, there has been described a wide band low pass amplifier having useful power gain and providing a pass band from very low frequencies to very high frequencies. The circuit allows the utilization of triode type devices in a very stable arrangement. Because of the parallel arrangement providing a low input impedance, relatively large power gain is provided with large bandwidths.

What is claimed is:

1. A wide band amplifier comprising a source of signals, a load, a terminating impedance, a series path including a plurality of delay sections coupled between said load and said terminating impedance, and a plurality of paths each coupled between said source of signals and a different one of a plurality of selected points of said series path, said plurality of paths each including a tube having a grid coupled to a source of reference potential and an anode to cathode path coupled to a selected number of delay sections, the selected number of delay sections of each path terminated at the cathode of the corresponding tube, the points in said series path and the number of delay sections in said plurality of paths selected so that signals transmitted from said source through said plurality of paths and through said series path from said selected points to said load have substantially equal time delays.

2. A circuit for amplifying signals between a source of signals and a load comprising a terminating impedance, a plurality of amplifying means each having first and second terminals, each of said amplifying means developing a first and second distributed capacitance at said first and second terminals and developing an impedance at said second terminal, a plurality of first delay sections coupled between said terminating impedance and said load and each to the first terminal of a different one of said amplifying means to include therein the first distributed capacitance developed by the corresponding amplifying means, a plurality of paths each coupled between the second terminal of a different one of said amplifying means and the source of signals, each path including a selected number of delay sections with each of the delay sections adjacent to one of said second terminals including the second distributed capacitance therein, the selected number of delay sections of each path terminated with the impedance at the second terminal of the corresponding amplifying means, the number of second delay sections selected so that each signal of a plurality of signals applied from said source, through one of said paths, through the first delay sections between the first terminal of the corresponding amplifying means coupled to said path and to said load have equal delay characteristics.

3. A wide band amplifier circuit comprising a source of signals, first and second terminating impedances, a plurality of triodes each having an anode, cathode and grid, said triodes having distributed capacitance between said anode and grid and between said cathode and grid and having a cathode to grid impedance, a source of reference potential coupled to the grids of said triodes, a first series path of delay sections coupled between said first and second terminating impedances and to the anodes of said triodes so that each of said delay sections including the distributed capacitance between the anode and grid of a different triode as a parameter, and a plurality of second paths of selected numbers of delay sections each coupled between the cathode of a different one of said plurality of triodes and said source of signals with the delay sections adjacent to the cathodes including the distributed capacitance between the cathode and grid as a parameter, the selected number of delay sections of each second path being terminated with the cathode to grid impedance of the corresponding tube, the number of delay sections of said second paths selected so that signals applied from said source through each of said second paths to the anodes of each of said triodes and through said first series path from the anodes of corresponding triodes to said second terminating impedance have equal time delays.

4. A wide band amplifier circuit for providing power gain comprising a source of signals, first and second terminating impedances, a first transmission path including a plurality of delay sections coupled between said first and second terminating impedances, a plurality of amplifying means having first and second terminals with said first terminals coupled to different delay sections of said first transmission path each of said amplifying means developing an impedance at said second terminal, a plurality of second transmission paths each coupled between said source of signals and the second terminal of a different one of said amplifying means, each of said second transmission paths having a selected number of delay sections with the delay sections of each path terminated with the impedance at the second terminal of the corresponding amplifying means, the number selected so that a signal applied from said source through any one of said second transmission paths and through predetermined delay sections of said first transmission path to said second terminating impedance have substantially equal time delays.

5. A wide band amplifier circuit for providing power gain comprising a source of signals, first and second impedances, a plurality of amplifying tubes each having an anode, a cathode and a grid, said tubes having distributed capacitances at said anodes and cathodes and having cathode to grid impedances, a source of reference potential coupled to said grids, a plurality of first delay sections coupled between said first and second impedances and each to the anode of a different tube, said first delay sections having delay characteristics as a function of the distributed capacitance at the anodes of the corresponding tubes, a plurality of paths each coupled between said source of signals and the cathode of a different tube, each path having a number of second delay sections such that signals applied from said source through any one of said paths and through a predetermined number of said first delay sections to said second impedance have substantially equal time delays the number of second delay sections of each path being terminated with the cathode to grid impedance of the corresponding tube, the second delay section in each path coupled to the cathode of said tube having delay characteristics as a function of the distributed capacitance at the cathode of the corresponding tube.

6. A wide band amplifier circuit comprising a source of signals, first and second impedances, a plurality of triodes each having an anode, a cathode and a grid, a source of reference potential coupled to the grids of said plurality of triodes, each of said triodes having a capacitance between said anode and said source of reference potential and between said cathode and said source of reference potential and having a cathode to grid impedance, a series path of first delay sections coupled between said first and second impedances, each of said first delay sections coupled to the anode of a different triode and including the capacitance between the anode and said source of reference potential of the triode coupled thereto as a parameter, a transformer coupled to said source of signals, and a plurality of paths each one having a selected number of second delay sections, each path coupled between the cathode of a different one of said triodes and said transformer, the second delay sections coupled to said cathodes including the capacitance between the anode and said source of reference potential as a parameter, the selected number of second delay sections of each path being terminated with the cathode to grid impedance of the corresponding triode, the number of delay sections of said plurality of paths selected so that signals applied between said source of signals and said second impedance have substantially equal time delays.

7. An amplifier responsive to a source of input signals comprising a load, impedance means, a series path including a plurality of delay sections having a point between each two adjacent delay sections and coupled between said impedance means and said load, a plurality of triodes each having an anode to cathode path and a grid, and a plurality of separate paths each including a delay section portion coupled at a first end to the source of input signals and each including the anode to cathode path of a different one of said triode tubes respectively coupled between a different one of said points of said series path and a second end of one of said delay section portions, each triode having a cathode to grid impedance, the delay section portion of each separate path being terminated with the cathode to grid impedance of the corresponding tube, a source of direct current reference potential coupled to the grid of each of said triode tubes, the delay section portion of each of said plurality of paths terminated at the anode to cathode path of the corresponding triode tube and including a selected number of delaly sections so that input signals transmitted to said load pass through an equal number of delay sections and have substantially equal delay characteristics.

References Cited by the Examiner

UNITED STATES PATENTS

| | | | |
|---|---|---|---|
| 2,727,100 | 12/55 | Hurvitz | 330—54 |
| 2,778,886 | 1/57 | Bradley | 330—54 |
| 2,904,646 | 9/59 | Ault | 330—54 |
| 2,958,046 | 10/60 | Watters | 330—54 |

ROY LAKE, *Primary Examiner.*

NATHAN KAUFMAN, *Examiner.*